US011828781B2

(12) United States Patent
Lu et al.

(10) Patent No.: US 11,828,781 B2
(45) Date of Patent: Nov. 28, 2023

(54) TRANSMISSION ABSORBING STRUCTURE AND ANTENNA IN-BAND CHARACTERISTICS TEST SYSTEM

(71) Applicant: 38TH RESEARCH INSTITUTE, CHINA ELECTRONICS TECHNOLOGY GROUP CORPORATION, Hefei (CN)

(72) Inventors: Xiaopeng Lu, Hefei (CN); Yan Li, Hefei (CN); Lei Sheng, Hefei (CN); Zicheng Zhou, Hefei (CN); Yufan Yao, Hefei (CN); Jialong Zhang, Hefei (CN)

(73) Assignee: 38TH RESEARCH INSTITUTE, CHINA ELECTRONICS TECHNOLOGY GROUP CORPORATION, Hefei (CN)

( * ) Notice: Subject to any disclaimer, the term of this patent is extended or adjusted under 35 U.S.C. 154(b) by 0 days.

(21) Appl. No.: 18/331,663

(22) Filed: Jun. 8, 2023

(65) Prior Publication Data
US 2023/0324444 A1 Oct. 12, 2023

Related U.S. Application Data

(63) Continuation of application No. PCT/CN2022/118910, filed on Sep. 15, 2022.

(30) Foreign Application Priority Data

Apr. 29, 2022 (CN) .......................... 202210462369.9

(51) Int. Cl.
*G01R 29/08* (2006.01)
*G01R 29/10* (2006.01)
(52) U.S. Cl.
CPC ......... *G01R 29/0821* (2013.01); *G01R 29/10* (2013.01)

(58) Field of Classification Search
CPC .......................... G01R 29/0821; G01R 29/10
See application file for complete search history.

(56) References Cited

U.S. PATENT DOCUMENTS

| 5,861,753 A | 1/1999 | Carbonini |
| 6,567,057 B1 * | 5/2003 | Sievenpiper ......... H01Q 15/008 343/756 |

(Continued)

FOREIGN PATENT DOCUMENTS

| CN | 1211832 A | 3/1999 |
| CN | 105425185 A | 3/2016 |

(Continued)

OTHER PUBLICATIONS

Gaosheng Li et al., "Radome Equivalent Transmission Line Theory and Application", Communications Technology, vol. 47, No. 1, Jan. 2014, pp. 7-12.

(Continued)

*Primary Examiner* — Timothy A Brainard
*Assistant Examiner* — Helena H Seraydaryan

(57) ABSTRACT

This application provides a transmission absorbing structure and an antenna in-band characteristics test system, relating to design of microwave antennas for radar and communication systems. The transmission absorbing structure includes a coupling feed structure provided with coupling slots for energy coupling with a to-be-tested antenna, two equivalent electric wall structures parallel to each other, and two equivalent magnetic wall structures parallel to each other. The two equivalent electric wall structures and the two equivalent magnetic wall structures together enclose the coupling feed structure, and form a transverse electromagnetic mode (TEM) waveguide. The system includes a vector (Continued)

network analyzer, a to-be-tested antenna electrically connected to the vector network analyzer, and a transmission absorbing structure.

9 Claims, 6 Drawing Sheets

(56) References Cited

U.S. PATENT DOCUMENTS

| | | |
|---|---|---|
| 7,576,703 B1 | 8/2009 | Herting et al. |
| 2020/0243967 A1 | 7/2020 | Sipp et al. |

FOREIGN PATENT DOCUMENTS

| | | | |
|---|---|---|---|
| CN | 105548729 A | 5/2016 | |
| CN | 208872779 U | 5/2019 | |
| CN | 110470874 A | 11/2019 | |
| CN | 112834830 A | 5/2021 | |
| CN | 112904095 A | 6/2021 | |
| CN | 213602012 U | 7/2021 | |
| CN | 114137481 A | 3/2022 | |
| CN | 114583428 A | 6/2022 | |
| JP | 2015049203 A | 3/2015 | |
| WO | WO-2010025470 A2 * | 3/2010 | ......... H01Q 13/0225 |

OTHER PUBLICATIONS

Wei Zhang et al., "Dual-Frequency Tunable Wave Absorbing Structure Based on Frequency Selective Surface", IEEE International Symposium on Antennas and Propagation;USNC/URSI National Radio Science Meeting, Jan. 2019, pp. 2057-2058.

Yi-Dan Han et al.,"Design of a Wave-Absorbing Frequency Selective Surface Unit", 2018 Cross Strait Quad-Regional Radio Science and Wireless Technology Conference (CSQRWC), Sep. 2018, Entire document.

Rui Long et al., "Calibration method of phased array based on near-field measurement system", 2014 IEEE Antennas and Propagation Society International Symposium (APSURSI), Sep. 2014, pp. 1161-1162.

Yuanyun Liu, "Missile Radome Electrical Test System Research and Design", China Excellent Doctoral Dissertation Full Text Database (Master) Information Technology Series, 2013, Entire document.

* cited by examiner

TRANSMISSION ABSORBING STRUCTURE AND ANTENNA IN-BAND CHARACTERISTICS TEST SYSTEM

CROSS-REFERENCE TO RELATED APPLICATIONS

This application is a continuation of International Patent Application No. PCT/CN2022/118910, filed on Sep. 15, 2022, which claims the benefit of priority from Chinese Patent Application No. 202210462369.9, filed on Apr. 29, 2022. The content of the aforementioned application, including any intervening amendments thereto, is incorporated herein by reference in its entirety.

TECHNICAL FIELD

This application relates to design of microwave antennas for radar and communication systems, and more particularly to a transmission absorbing structure and an antenna in-band characteristics test system.

BACKGROUND

Antenna is an important part of radar and communication systems, and its performance is closely associated with the system performance. With the development of radar and communication systems towards high resolution and large data rate, higher requirements have been put forward for the instantaneous bandwidth of antennas. The in-band amplitude-phase characteristics of the antenna have an important impact on the performance of an electronic information system. For a synthetic aperture radar (SAR), the antenna in-band amplitude-phase characteristics will directly affect the peak side-lobe ratio of point targets, thus affecting the imaging quality of the target. To compensate for the in-band amplitude-phase characteristic fluctuation of the antenna, pre-distortion of the in-band phase fluctuation of the transmitted signal and equalization of the in-band amplitude-phase fluctuation of the receiver are required, for which it is necessary to acquire the antenna in-band amplitude-phase characteristics through testing in advance.

Conventional test methods for obtaining the in-band amplitude-phase characteristics of antennas mainly include the near-field method and the far-field method.

Both the near-field method and the far-field method need to be performed in an open microwave anechoic chamber. Moreover, they both have high requirements for the test site, complicated calibration process, and poor calibration accuracy. In view of this, it is urgently required to develop a new test method for obtaining the in-band amplitude-phase characteristics of antennas.

SUMMARY

To overcome the shortcomings (such as high requirements for test sites) in the prior art, the present disclosure provides a transmission absorbing structure and an antenna in-band characteristics test system.

Technical solutions of this application are described below.

In the first aspect, the disclosure provides a transmission absorbing structure, comprising:
  a coupling feed structure;
  two equivalent electric wall structures parallel to each other; and
  two equivalent magnetic wall structures parallel to each other;
  wherein the coupling feed structure is provided with coupling slots; the coupling slots are configured for energy coupling with a to-be-tested antenna;
  the two equivalent electric wall structures and the two equivalent magnetic wall structures are together configured to enclose the coupling feed structure, and form a transverse electromagnetic mode (TEM) waveguide;
  a height of a part of each of the two equivalent electrical wall structures higher than the coupling feed structure is less than a medium-frequency operating wavelength of the to-be-tested antenna; and a height of a part of each of the two equivalent magnetic wall structures higher than the coupling feed structure is less than the medium-frequency operating wavelength of the to-be-tested antenna.

In some embodiments, when the to-be-tested antenna is a one-dimensional antenna array, the number of the coupling slots is the same as the number of units of the to-be-tested antenna; and a spacing of the coupling slots is the same as a spacing of the units of the to-be-tested antenna.

In some embodiments, when the to-be-tested antenna is a unit in a two-dimensional phased antenna array, the coupling slots are perpendicular to a polarization direction of the to-be-tested antenna; and the coupling slots are parallel to each other.

In some embodiments, the coupling slots are configured as a cavity-type parallel double-slot structure.

In some embodiments, the two equivalent electric wall structures are two metal plates; and a distance between the two metal plates is the same as an E-plane spacing of the units of the one-dimensional antenna array along an E-field direction.

In some embodiments, each of the two equivalent magnetic wall structures is realized by a microstrip circuit; and a distance between the two equivalent magnetic wall structures is the same as an H-plane spacing of units of the two-dimensional phased antenna array along an H-field direction.

In the second aspect, this application provides an antenna in-band characteristics test system, comprising:
  a vector network analyzer;
  a to-be-tested antenna electrically connected to the vector network analyzer;
  a first transmission absorbing structure;
  wherein the first transmission absorbing structure is electrically connected to the vector network analyzer and located in an inductive field region of the to-be-tested antenna; and
  the first transmission absorbing structure comprises a coupling feed structure, two equivalent electric wall structures parallel to each other, and two equivalent magnetic wall structures parallel to each other;
  wherein the coupling feed structure is provided with coupling slots; the coupling slots are configured for energy coupling with the to-be-tested antenna;
  the two equivalent electric wall structures and the two equivalent magnetic wall structures are together configured to enclose the coupling feed structure, and form a TEM waveguide; and
  a height of a part of each of the two equivalent electrical wall structures higher than the coupling feed structure is less than a medium-frequency operating wavelength of the to-be-tested antenna; and a height of a part of each of the two equivalent magnetic wall structures higher than the coupling feed structure is less than the medium-frequency operating wavelength of the to-be-tested antenna.

In some embodiments, the antenna in-band characteristics test system further comprises a second transmission absorbing structure; and the second transmission absorbing structure is configured to replace the to-be-tested antenna to calibrate the antenna in-band characteristics test system before testing.

In some embodiments, the antenna in-band characteristics test system further comprises a temperature chamber for accommodating the to-be-tested antenna and the transmission absorbing structure during the test.

In some embodiments, when the to-be-tested antenna is a one-dimensional antenna array, the number of the coupling slots is the same as the number of units of the to-be-tested antenna; and a spacing of the coupling slots is the same as a spacing of the units of the to-be-tested antenna;

In some embodiments, when the to-be-tested antenna is a unit in a two-dimensional phased antenna array, the coupling slots are perpendicular to a polarization direction of the to-be-tested antenna; and the coupling slots are parallel to each other;

the two equivalent electric wall structures are two metal plates; and a distance between the two metal plates is the same as an E-plane spacing of units of the one-dimensional antenna array along an E-field direction; and each of the two equivalent magnetic wall structures is realized by a microstrip circuit; and a distance between the two equivalent magnetic wall structures is the same as an H-plane spacing of units of the two-dimensional phased antenna array along an H-field direction.

This application provides a transmission absorbing structure and a system for testing in-band characteristics of an antenna. Compared with the prior art, this application at least has the following beneficial effects.

(1) In this application, the transmission absorbing structure provided herein includes paired equivalent electric walls (electric wall to electric wall) and paired equivalent magnetic walls (magnetic wall to magnetic wall), which together form a standard TEM waveguide. In this case, the irradiation of plane waves to a to-be-tested antenna can be simulated in a closed environment.

(2) The system provided herein is constructed based on a closed induction field area, with lower electromagnetic leakage compared with the conventional near-field or far-field methods. Moreover, absorbing materials are not required in the test environment, and it is not needed to perform the tests in a microwave near-field or far-field anechoic chamber.

(3) The system provided herein can be accurately self-calibrated by replacing the to-be-tested antenna with another mechanically-fabricated absorbing structure with identical in-band characteristics.

(4) The to-be-tested antenna and the absorbing structure of the system provided herein can be completely placed in a common temperature chamber such that the in-band characteristics of the antenna can be tested in a wide temperature range.

BRIEF DESCRIPTION OF THE DRAWINGS

To illustrate the technical solutions in the embodiments of the present disclosure or in the prior art more clearly, the accompanying drawings needed in the description of the embodiments or prior art will be described briefly below. Apparently, presented in the accompanying drawings are only some embodiments of the present disclosure. Other drawings may be obtained by one of ordinary skill in the art without paying any creative effort based on these drawings.

DETAILED DESCRIPTION OF EMBODIMENTS

To make the objects, technical solutions and advantages of the embodiments of the present disclosure clearer, the technical solutions in the embodiments will be described clearly and completely below. Obviously, described below are merely some embodiments of the present disclosure, which are not intended to limit the disclosure. Based on the embodiments provided herein, all other embodiments obtained by one of ordinary skill in the art without paying any creative work shall fall within the scope of the present disclosure.

This application provides a transmission absorbing structure and an antenna in-band characteristics test system to solve the problem of high requirements for the test site in the conventional methods.

The technical solutions in the embodiments of the present disclosure are to solve the above technical problems, and the overall idea is described as follows.

A first object of this application is to provide a transmission absorbing structure, which can be used for testing in-band characteristics of an antenna.

A second object of this application is to provide an antenna in-band characteristics test system, which can solve the problem of high requirements for the test site in conventional methods The in-band characteristics of an antenna are tested by using a conventional near-field method through the following steps.

(S1) A to-be-tested antenna is set up in a microwave anechoic chamber according to the specific requirements for planar near-field testing specified in the China Electronics Industry Standard SJ20884-2003 "Testing Methods for Phased Array Antenna", where the distance between the test probe and the to-be-tested antenna needs to be controlled to be 3-10λ.

Figure 1:
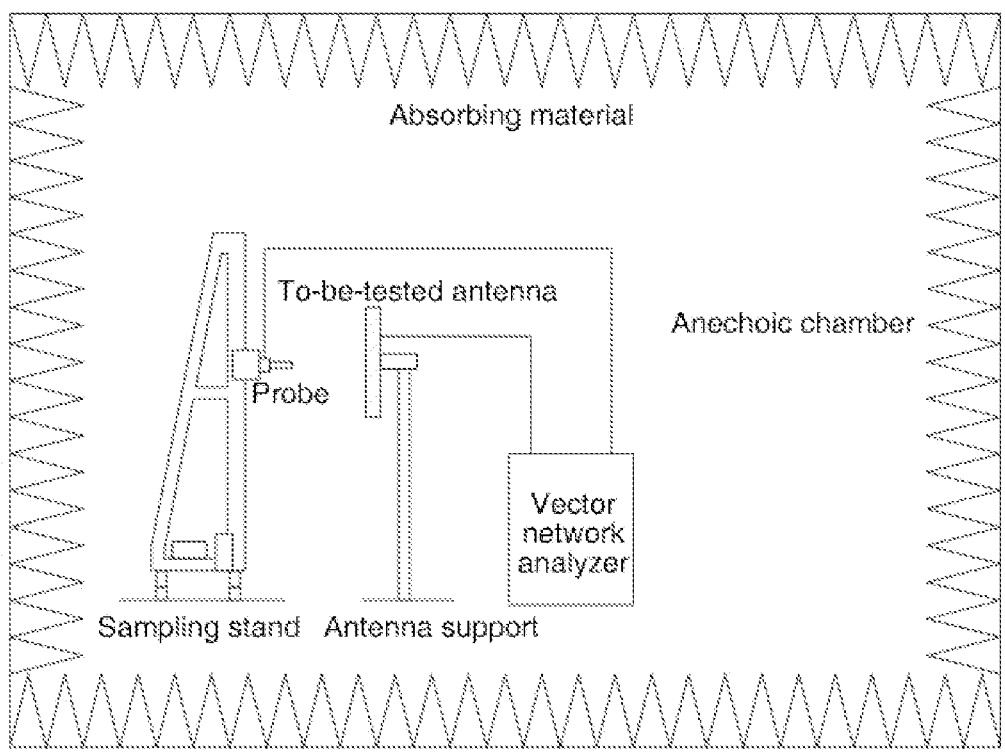
FIG. 1 is a schematic diagram of a conventional test system used in a near-field method for testing in-band characteristics of an antenna.

(S2) The test system is connected to the to-be-tested antenna according to the connection relationship shown in FIG. 1.

(S3) The amplitude phase distribution of the aperture field of the antenna at different frequency points in the band is collected by using the planar near-field test system.

(S4) The far-field amplitude phase characteristics of the to-be-tested antenna containing the in-band amplitude phase characteristics of the test system is obtained by using the near- and far-field transformation.

(S5) The to-be-tested antenna is replaced with a standard antenna with known in-band amplitude phase characteristics.

(S6) Steps (S1)-(S4) are repeated by using the planar near field, where the distance between the probe and the standard antenna should be the same as the distance between the probe and the to-be-tested antenna in step (S1), to obtain the in-band amplitude phase characteristics of the standard antenna containing the in-band amplitude phase characteristics of the test system.

(S7) The in-band amplitude phase characteristic of the test system is calibrated according to the known in-band amplitude phase characteristic of the standard antenna.

(S8) Based on the calibration data of the in-band amplitude phase characteristics of the test system, the in-band amplitude phase characteristics of the antenna to be tested are obtained.

By analyzing the above steps, the conventional method has the following disadvantages.

(1) The in-band amplitude characteristics of the test system need to be calibrated.

(2) The standard antenna currently used for antenna testing is merely the standard gain horn antenna. However, the manufacturer of the standard gain horn antenna only provides the in-band amplitude characteristics of the antenna, but not the in-band phase characteristics of the antenna. Therefore, the phase characteristics of this antenna need to be calibrated independently by using the far-field method.

(3) The test needs to be performed in the microwave anechoic chamber, allowing for high requirements for the test site and making it difficult to carry out the temperature characteristics test.

To overcome the above problems, this application provides a system for testing in-band characteristics of an antenna based on the induction field area. The system includes a transmission absorbing structure 1, a to-be-tested antenna 2, a vector network analyzer 3, and corresponding test cables. The to-be-tested antenna 2 and the transmission absorbing structure 1 are limitedly placed in parallel with each other. The transmission absorbing structure 1 can completely receive the electromagnetic wave radiated by the to-be-tested antenna 2, and the transmission absorbing structure 1 can receive the electromagnetic energy in the induction field of the antenna in equal amplitude and in phase, thus simulating the irradiation of the plane wave on the antenna.

To better understand the above technical solutions, the technical solutions will be described in detail below with reference to the accompanying drawings and the specific implementation.

This application provides a transmission absorbing structure, which includes a coupling feed structure 11, two equivalent electric wall structures 12 parallel to each other, and two equivalent magnetic wall structures 13 parallel to each other.

The coupling feed structure 11 is provided with coupling slots 111 for energy coupling with a to-be-tested antenna 2.

The two equivalent electric wall structures 12 and the two equivalent magnetic wall structures 13 are together configured to enclose the coupling feed structure 11, and form a transverse electromagnetic mode (TEM) waveguide.

A height H of a part of each of the two equivalent electrical wall structures 12 higher than the coupling feed structure is less than a medium-frequency (MF) operating wavelength of the to-be-tested antenna 2, and a height of a part of each of the two equivalent magnetic wall structures 13 higher than the coupling feed structure 11 is less than the MF operating wavelength of the to-be-tested antenna 2.

In this application, the equivalent electric wall structures and equivalent magnetic wall structures are used together to equate a TEM mode waveguide. Theoretically, four objects placed paired electric walls (electric wall to electric wall) and paired magnetic walls (magnetic wall to magnetic wall) form a standard TEM mode waveguide, which can simulate the irradiation of the plane wave on the to-be-tested antenna.

Embodiment 1

In this embodiment, the to-be-tested antenna 2 is an antenna array for a one-dimensional (1D) large-angle scanning phased array, specifically, a line polarized slot waveguide array containing six slots as radiation units, with the polarization direction perpendicular to the array direction and an array spacing of $0.72\lambda$, ($\lambda$, is the MF operating wavelength).

Figure 2:
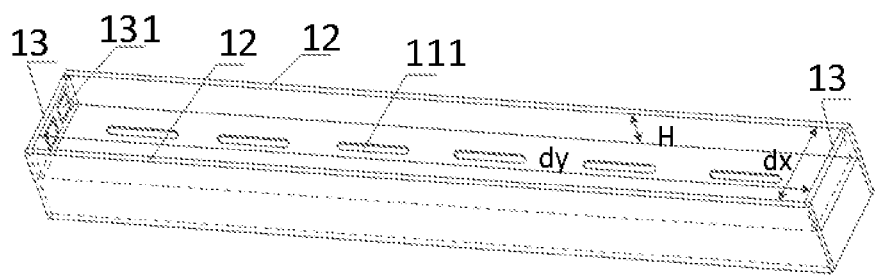
FIG. 2 is a schematic diagram of a transmission absorbing structure for testing of in-band characteristics of a one-dimensional antenna array according to Embodiment 1 of the present disclosure.

Therefore, as shown in FIG. 2, this embodiment provides a transmission absorbing structure, which includes a coupling feed structure 11 for energy coupling with a to-be-tested antenna 2, two equivalent electric wall structures 12 parallel to each other, and two equivalent magnetic wall structures 13 parallel to each other.

Specifically, in this embodiment, the coupling feed structure 11 adopts the same coupling feed structure as the conventional slot waveguide antenna, which is provided with six coupling slots 111 with the same spacing as the radiation units of the to-be-tested antenna, so as to carry out a strong coupling of electromagnetic energy with the radiation units of the to-be-tested antenna.

Specifically, in this embodiment, the two equivalent electric wall structures 12 are two metal plates such that they are equivalent to equivalent electrical walls perpendicular to the electric field radiated by the antenna. A distance between the two metal plates is the same as an E-plane spacing of the units of the to-be-tested antenna 2 along an E-field direction.

Specifically, in this embodiment, each of the two equivalent magnetic wall structures 13 is realized by a microstrip circuit. For example, the two equivalent magnetic wall structures 13 are two dielectric double-sided circuit boards. The distance dy between two dielectric double-sided circuit boards is the same as the length of the H-plane of the to-be-tested antenna 2, and meantime a periodic circuit 131 is etched on the inner surface of the two dielectric double-sided circuit boards such that it is designed as an artificial equivalent magnetic wall in the operating frequency band.

The two equivalent electric wall structures 12 and the two equivalent magnetic wall structures 13 are together configured to enclose the coupling feed structure 11 to form a TEM waveguide.

A height of a part of each of the two equivalent electrical wall structures 12 higher than the coupling feed structure is less than a medium-frequency operating wavelength of the to-be-tested antenna 2. A height of a part of each of the two equivalent magnetic wall structures 13 higher than the coupling feed structure 11 is less than the medium-frequency operating wavelength of the to-be-tested antenna 2.

The TEM waveguide formed by the equivalent electrical wall structures 12 and the equivalent magnetic wall structures 13, the coupling slots for energy coupling with the antenna, and the coupling feed structure for excitation to the coupling slots, together realize the transmission absorbing function and enable the testing of the in-band amplitude and phase characteristics of the antenna in closed space.

Embodiment 2

In this embodiment, the to-be-tested antenna 2 is an antenna array for a two-dimensional (2D) large-angle scanning phased array, specifically, a linearly polarized microstrip patch antenna with a unit spacing of dx=0.5λ, and dy=0.55λ, (λ, is the MF operating wavelength) in the array and the polarization direction of the antenna unit is along the x-direction.

Figure 3:
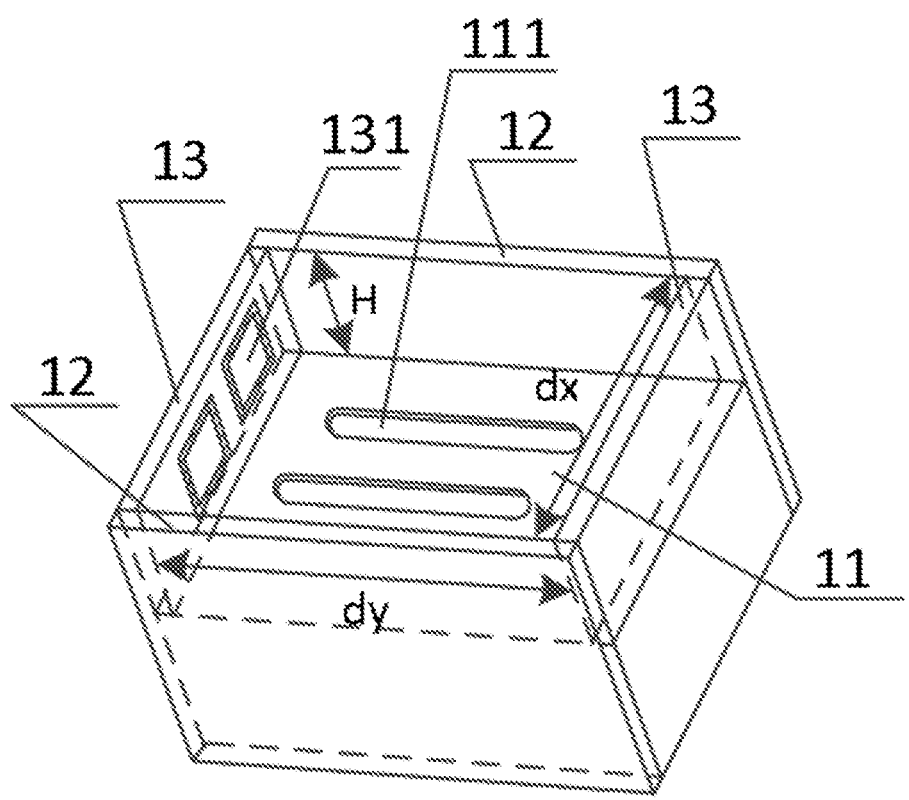
FIG. 3 is a schematic diagram of a transmission absorbing structure for testing of in-band characteristics of a two-dimensional phased antenna array according to Embodiment 2 of the present disclosure.

Therefore, as shown in FIG. 3, this embodiment provides a transmission absorbing structure, which includes a coupling feed structure 11 configured for energy coupling with a to-be-tested antenna 2, two equivalent electric wall structures 12 parallel to each other, and two equivalent magnetic wall structures 13 parallel to each other.

Specifically, in this embodiment, the coupling feed structure 11 is a cavity-type parallel double slot structure, which is provided with two coupling slots 111 parallel to each other and perpendicular to the polarized direction of the to-be-tested antenna 2 for electromagnetic coupling transmission with the units of the to-be-tested antenna.

Specifically, in this embodiment, the two equivalent electric wall structures 12 are two metal plates such that they are equivalent to equivalent electrical walls perpendicular to the electric field radiated by the antenna. A distance between the two metal plates is the same as an E-plane spacing of the units of the to-be-tested antenna 2 along an E-field direction.

Specifically, in this embodiment, each of the two equivalent magnetic wall structures 13 is realized by a microstrip circuit. For example, the two equivalent magnetic wall structures 13 are two dielectric double-sided circuit boards. The distance dy between two dielectric double-sided circuit boards is the same as the length of the H-plane of the to-be-tested antenna 2, and meantime a periodic circuit 131 is etched on the inner surface of the two dielectric double-sided circuit boards such that it is designed as an artificial equivalent magnetic wall in the operating frequency band.

The two equivalent electric wall structures 12 and the two equivalent magnetic wall structures 13 are together configured to enclose the coupling feed structure 11 to form a TEM waveguide.

A height of a part of each of the two equivalent electrical wall structures 12 higher than the coupling feed structure is less than a medium-frequency operating wavelength of the to-be-tested antenna 2. A height of a part of each of the two equivalent magnetic wall structures 13 higher than the coupling feed structure 11 is less than a medium-frequency operating wavelength of the to-be-tested antenna 2.

The TEM waveguide formed by the equivalent electrical wall structures 12 and the equivalent magnetic wall structures 13, the coupling slots for energy coupling with the antenna, and the coupling feed structure for excitation to the coupling slots, together realize the transmission absorbing function and enable the testing of the in-band amplitude and phase characteristics of the antenna in closed space.

Embodiment 3

Figure 4:
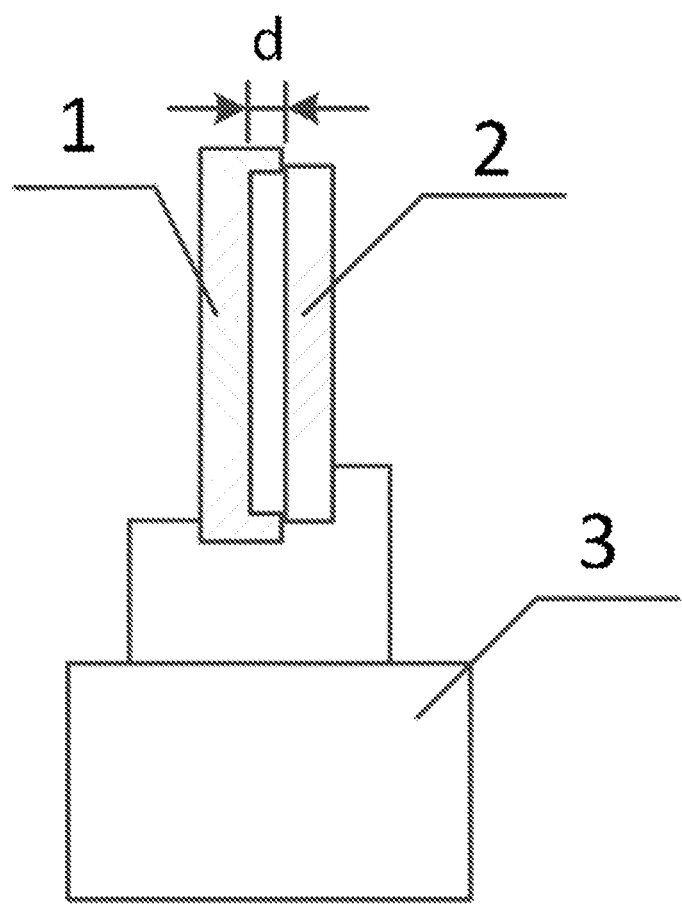
FIG. 4 is a schematic diagram of a test system for testing in-band characteristics of an antenna by an inductive field method of Embodiment 3 of the present disclosure.

As shown in FIG. 4, this application further provides an antenna in-band characteristics test system, which includes a vector network analyzer 3, a to-be-tested antenna 2 electrically connected to the vector network analyzer 3, and a transmission absorbing structure 1.

The first transmission absorbing structure 1 is electrically connected to the vector network analyzer 3 and located in an inductive field region of the to-be-tested antenna 2.

The first transmission absorbing structure 1 includes a coupling feed structure 11, two equivalent electric wall structures 12 parallel to each other, and two equivalent magnetic wall structures 13 parallel to each other, where the coupling feed structure 11 is provided with coupling slots 111 for energy coupling with the to-be-tested antenna 2.

The two equivalent electric wall structures 12 and the two equivalent magnetic wall structures 13 are together configured to enclose the coupling feed structure 11, and form a TEM waveguide.

A height of a part of each of the two equivalent electrical wall structures 12 higher than the coupling feed structure is less than a medium-frequency operating wavelength of the to-be-tested antenna. A height of a part of each of the two equivalent magnetic wall structures 13 higher than the coupling feed structure 11 is less than the medium-frequency operating wavelength of the to-be-tested antenna.

Optionally, the system further includes another transmission absorbing structure 4, which is configured to replace the to-be-tested antenna, so as to calibrate the system before testing.

Optionally, the system further includes a temperature chamber (not shown in the figures) for accommodating the to-be-tested antenna 2 and the transmission absorbing structure 1 during the test.

The system of the embodiment of the present disclosure is operated through the following steps.

(S1) The to-be-tested antenna 2 and the transmission absorbing structure 1 are set up according to FIG. 4. The to-be-tested antenna 2 and the transmission absorbing structure 1 are oppositely arranged in parallel, with a spacing of less than k, that is, the spacing d between the electromagnetic interface surface of the transmission absorbing structure 1 and the radiating end surface of the unit of the to-be-tested antenna 2 is less than k.

(S2) Transmission pass-through calibration is performed on the vector network analyzer 3 and the test cables.

(S3) The amplitude phase propagation constants between the transmission absorbing structure 1 and the to-be-tested antenna 2 is tested.

(S4) Two identical transmission absorbing structures 1 and 4 are oppositely arranged in parallel according to FIG. 4, with a spacing the same as that in step (S1). Then steps (S1)-(S3) are repeated to complete the calibration of the amplitude phase characteristics of the transmission absorbing structure 1.

(S5) The in-band amplitude phase characteristics of the to-be-tested antenna 2 is obtained by data processing.

In addition, by placing the to-be-tested antenna and the transmission absorbing structure 1 in a common temperature chamber and setting the temperature chamber to a desired temperature, the temperature characteristics of the amplitude phase of the antenna can be tested by using this test method and the transmission absorbing structure 1.

It is understood that the transmission absorbing structure 1 provided by this embodiment corresponds to the transmission absorbing structure 1 in Embodiments 1 and 2. Therefore, the relevant explanation, examples, beneficial effects and other parts of the transmission absorbing structure 1 can be referred to the corresponding content of the transmission absorbing structure 1 in Embodiments 1 and 2, which will not be repeated here.

Figure 5:
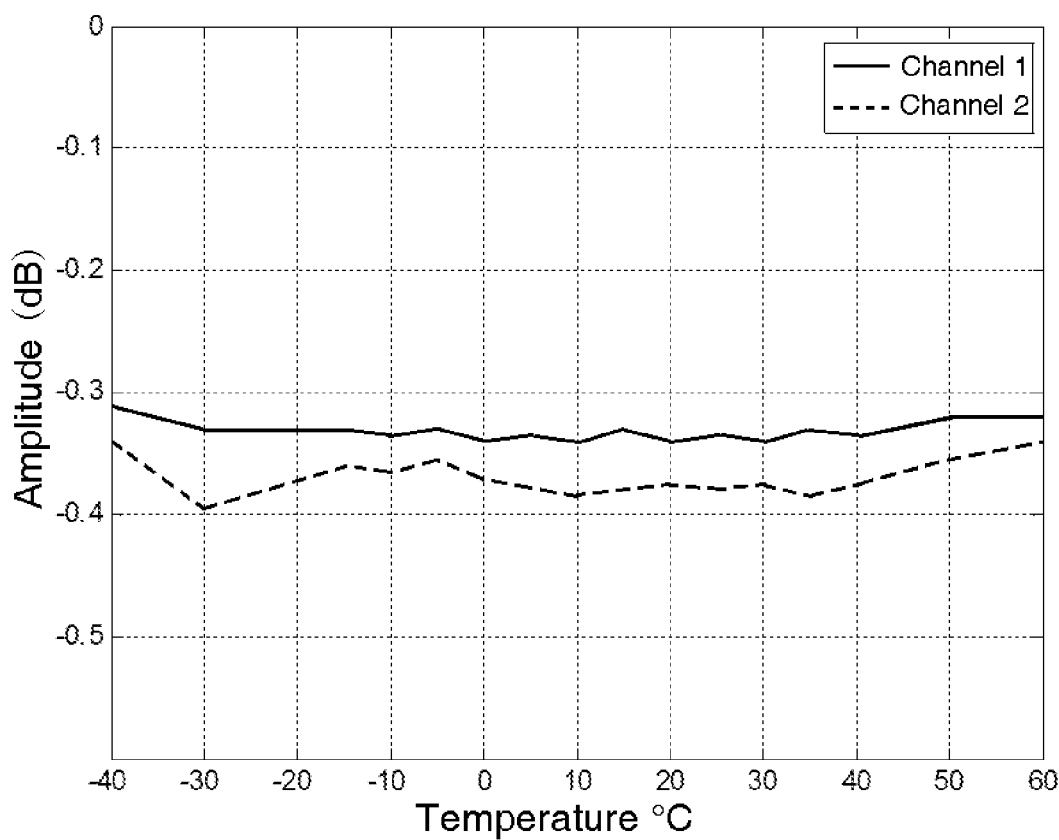
FIG. 5 is a curve diagram showing changes of transmission amplitude of a to-be-tested antenna with temperature at a central operating frequency according to Embodiment 1 of the present disclosure.
Figure 6:
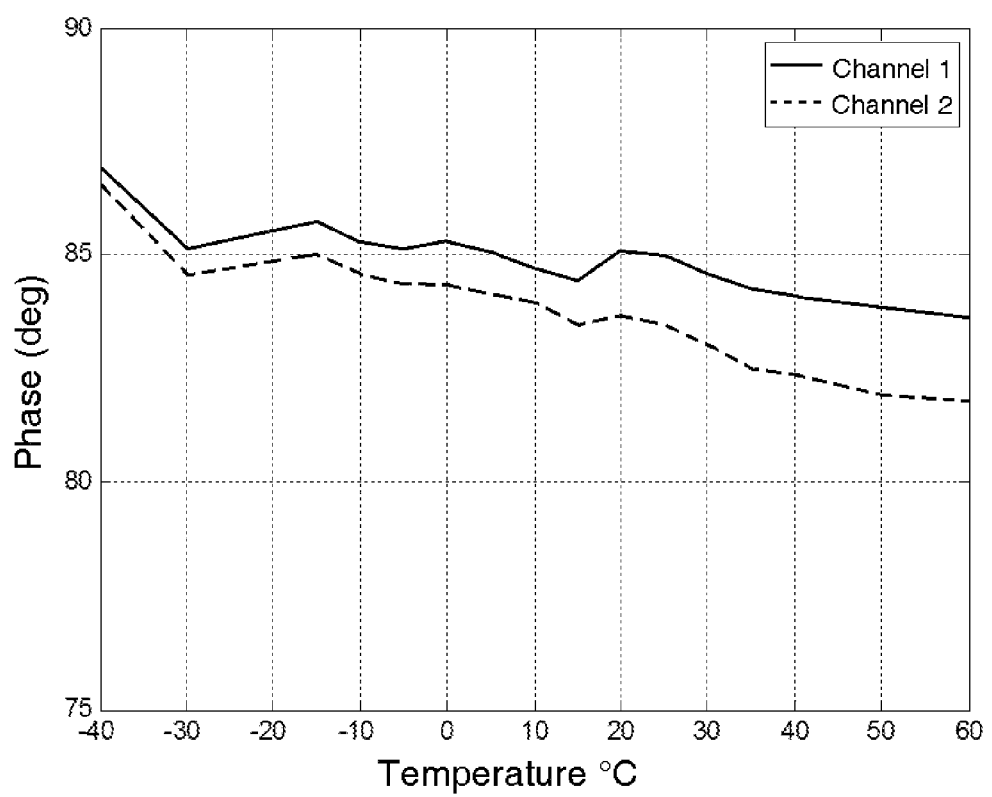
FIG. 6 is a curve diagram showing changes of phase of a to-be-tested antenna with temperature at the central operating frequency according to Embodiment 1 of the present disclosure.

As shown in FIGS. 5 and 6, a test system is constructed to test the effect of the working temperature on the amplitude and phase characteristics of two line arrays of an to-be-tested antenna array consisting of eight lines in a temperature chamber. FIG. 5 is a curve diagram showing changes of transmission amplitude of a to-be-tested antenna with temperature at a central operating frequency. It can be seen that the amplitude characteristics of the two line arrays change by less than 0.1 dB within the temperature change range of 100° C. FIG. 6 is a curve diagram showing changes of phase of a to-be-tested antenna with temperature at the central operating frequency. It can be seen that the insertion phase of the two line arrays decreases with the increase of temperature, and the changes of insertion phase of the two line arrays with temperature are basically the same. If the insertion phase at room temperature is normalized, the phase difference in the wide temperature range will be less than 1°, indicating that the test system and method provided herein have high test accuracy for the amplitude phase.

In conclusion, compared with the prior art, this application at least has the following beneficial effects.

(1) The transmission absorbing structure provided herein includes paired equivalent electric walls (electric wall to electric wall) and paired equivalent magnetic walls (magnetic wall to magnetic wall), which together form a standard TEM waveguide. In this case, the irradiation of plane waves to a to-be-tested antenna can be simulated in a closed environment.

(2) The system provided herein is constructed based on a closed induction field area, with lower electromagnetic leakage compared with the conventional near-field or far-field methods. Moreover, absorbing materials are not required in the test environment, and it is not needed to perform the tests in a microwave near-field or far-field anechoic chamber.

(3) The system provided herein can be accurately self-calibrated by replacing the to-be-tested antenna with another mechanically-fabricated absorbing structure with identical in-band characteristics.

(4) The to-be-tested antenna and the absorbing structure of the system provided herein can be completely placed in a common temperature chamber such that the in-band characteristics of the antenna in a wide temperature range can be tested.

Through the description of the above embodiments, it should be clearly understood by those skilled in the art that individual embodiments can be implemented with the help of software and the necessary general hardware platform. Based on this, the above technical solutions may be essentially embodied in the form of a software product or the part of the above technical solutions that contributes to the prior art may be embodied in the form of a software product, which can be stored in a computer readable storage medium, such as ROM/RAM, disk, CD-ROM, etc. The software product includes a number of instructions to enable a computer device (e.g., personal computer, server, and network device) to execute methods provided in each embodiment, or some parts of one embodiment. As used herein, the relationship terms, such as "first" and "second", are merely used to distinguish one entity or operation from another, and do not necessarily require or imply any actual relationship or order between these entities or operations. Furthermore, the terms "including", "comprising" or any other variants thereof are intended to cover non-exclusive inclusion, such that a process, method, article or apparatus including a series of elements includes not only those elements but also other elements not expressly listed, or elements that are inherent to such a process, method, article or apparatus. Without further limitations, the phrase "including a . . . " do not preclude the existence of additional identical elements in the process, method, article or apparatus including said elements defined thereby.

Described above are merely illustrative of the technical solutions of the present disclosure, and are not intended to limit the present disclosure. Despite the detailed description of the present disclosure with reference to the aforementioned embodiments, it should be understood that one of ordinary skill in the art can still make modifications, changes and substitutions to the technical solutions in individual aforementioned embodiments. Those modifications, changes and substitutions made without departing from the spirit and scope of the disclosure shall still fall within the scope of the disclosure defined by the appended claims.

What is claimed is:

1. A transmission absorbing structure, comprising:
   a coupling feed structure;
   two equivalent electric wall structures parallel to each other; and
   two equivalent magnetic wall structures parallel to each other;
   wherein the coupling feed structure is provided with coupling slots for energy coupling with a to-be-tested antenna;
   the two equivalent electric wall structures and the two equivalent magnetic wall structures are together configured to enclose the coupling feed structure, and form a transverse electromagnetic mode (TEM) waveguide; and
   a height of a part of each of the two equivalent electrical wall structures higher than the coupling feed structure is less than a medium-frequency operating wavelength of the to-be-tested antenna; and a height of a part of each of the two equivalent magnetic wall structures higher than the coupling feed structure is less than the medium-frequency operating wavelength of the to-be-tested antenna.

2. The transmission absorbing structure of claim 1, wherein when the to-be-tested antenna is a one-dimensional antenna array, the number of the coupling slots is the same as the number of units of the to-be-tested antenna; and a spacing of the coupling slots is the same as a spacing of the units of the to-be-tested antenna.

3. The transmission absorbing structure of claim 1, wherein when the to-be-tested antenna is a unit in a two-dimensional phased antenna array, the coupling slots are perpendicular to a polarization direction of the to-be-tested antenna; and the coupling slots are parallel to each other.

4. The transmission absorbing structure of claim 3, wherein the coupling slots are configured as a cavity-type parallel double-slot structure.

5. The transmission absorbing structure of claim 1, wherein the two equivalent electric wall structures are two metal plates; and a distance between the two metal plates is the same as an E-plane spacing of the units of the to-be-tested antenna along an E-field direction.

6. The transmission absorbing structure of claim 3, wherein each of the two equivalent magnetic wall structures is realized by a microstrip circuit; and a distance between the two equivalent magnetic wall structures is the same as an H-plane spacing of units of the to-be-tested antenna along an H-field direction.

7. An antenna in-band characteristics test system, comprising:
a vector network analyzer;
a to-be-tested antenna electrically connected to the vector network analyzer;
a first transmission absorbing structure;
wherein the first transmission absorbing structure is electrically connected to the vector network analyzer, and is located in an inductive field region of the to-be-tested antenna; and
the first transmission absorbing structure comprises a coupling feed structure, two equivalent electric wall structures parallel to each other, and two equivalent magnetic wall structures parallel to each other;
wherein the coupling feed structure is provided with coupling slots for energy coupling with the to-be-tested antenna;
the two equivalent electric wall structures and the two equivalent magnetic wall structures are together configured to enclose the coupling feed structure, and form a TEM waveguide; and
a height of a part of each of the two equivalent electrical wall structures higher than the coupling feed structure is less than a medium-frequency operating wavelength of the to-be-tested antenna; and a height of a part of each of the two equivalent magnetic wall structures higher than the coupling feed structure is less than the medium-frequency operating wavelength of the to-be-tested antenna.

8. The antenna in-band characteristics test system of claim 7, further comprising:
a second transmission absorbing structure;
wherein the second transmission absorbing structure is configured to replace the to-be-tested antenna to calibrate the antenna in-band characteristics test system before testing.

9. The antenna in-band characteristics test system of claim 7, wherein when the to-be-tested antenna is a one-dimensional antenna array, the number of the coupling slots is the same as the number of units of the to-be-tested antenna; and a spacing of the coupling slots is the same as a spacing of the units of the to-be-tested antenna;
when the to-be-tested antenna is a unit in a two-dimensional phased antenna array, the coupling slots are perpendicular to a polarization direction of the to-be-tested antenna; and the coupling slots are parallel to each other;
the two equivalent electric wall structures are two metal plates; and a distance between the two metal plates is the same as an E-plane spacing of units of the one-dimensional antenna array along an E-field direction; and
each of the two equivalent magnetic wall structures is realized by a microstrip circuit; and a distance between the two equivalent magnetic wall structures is the same as an H-plane spacing of units of the two-dimensional phased antenna array along an H-field direction.

* * * * *